US009755663B1

(12) United States Patent
Ogata

(10) Patent No.: US 9,755,663 B1
(45) Date of Patent: Sep. 5, 2017

(54) PARALLEL-SERIAL CONVERSION CIRCUIT, INFORMATION PROCESSING APPARATUS AND TIMING ADJUSTMENT METHOD

(71) Applicant: FUJITSU LIMITED, Kawasaki-shi, Kanagawa (JP)

(72) Inventor: Yuuki Ogata, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/385,546

(22) Filed: Dec. 20, 2016

(30) Foreign Application Priority Data

Feb. 19, 2016 (JP) ................. 2016-029831

(51) Int. Cl.
| | |
|---|---|
| H03M 9/00 | (2006.01) |
| H04L 7/00 | (2006.01) |
| H04L 7/033 | (2006.01) |
| G06F 1/10 | (2006.01) |
| H04L 25/02 | (2006.01) |

(52) U.S. Cl.
CPC ............... H03M 9/00 (2013.01); G06F 1/10 (2013.01); H04L 7/0008 (2013.01); H04L 7/033 (2013.01); H04L 7/0334 (2013.01); H04L 25/0272 (2013.01)

(58) Field of Classification Search
CPC .... H03M 9/00; H04L 25/0272; H04L 7/0008; H04L 7/0334; H04L 7/033; G06F 1/10
USPC ........ 341/101, 100; 375/257, 373, 354, 355, 375/356
See application file for complete search history.

(56) References Cited

U.S. PATENT DOCUMENTS

| | | | |
|---|---|---|---|
| 2007/0064781 A1 | 3/2007 | Yamaguchi et al. | |
| 2011/0122002 A1* | 5/2011 | Tsunoda ................. | H03M 9/00 341/101 |

FOREIGN PATENT DOCUMENTS

| | | |
|---|---|---|
| JP | 58-056553 | 4/1983 |
| JP | 2007-082147 | 3/2007 |

* cited by examiner

Primary Examiner — Joseph Lauture
(74) Attorney, Agent, or Firm — Fujitsu Patent Center

(57) ABSTRACT

A parallel-serial conversion circuit including a data transmission unit to output first data and second data of a prescribed pattern in accordance with a second clock obtained by dividing a first clock, a first flip flop to receive the first data so as to output the first data in accordance with the first clock, a second flip flop to receive the second data so as to output the second data in accordance with the first clock, a selector to select one of the first data and the second data so as to output the selected data in accordance with the first clock, and an adjustment unit to compare the second data to be received by the second flip flop and the first data output from the first flip flop so as to adjust, based on a comparison result, a timing for the first flip flop to receive the first data.

15 Claims, 13 Drawing Sheets

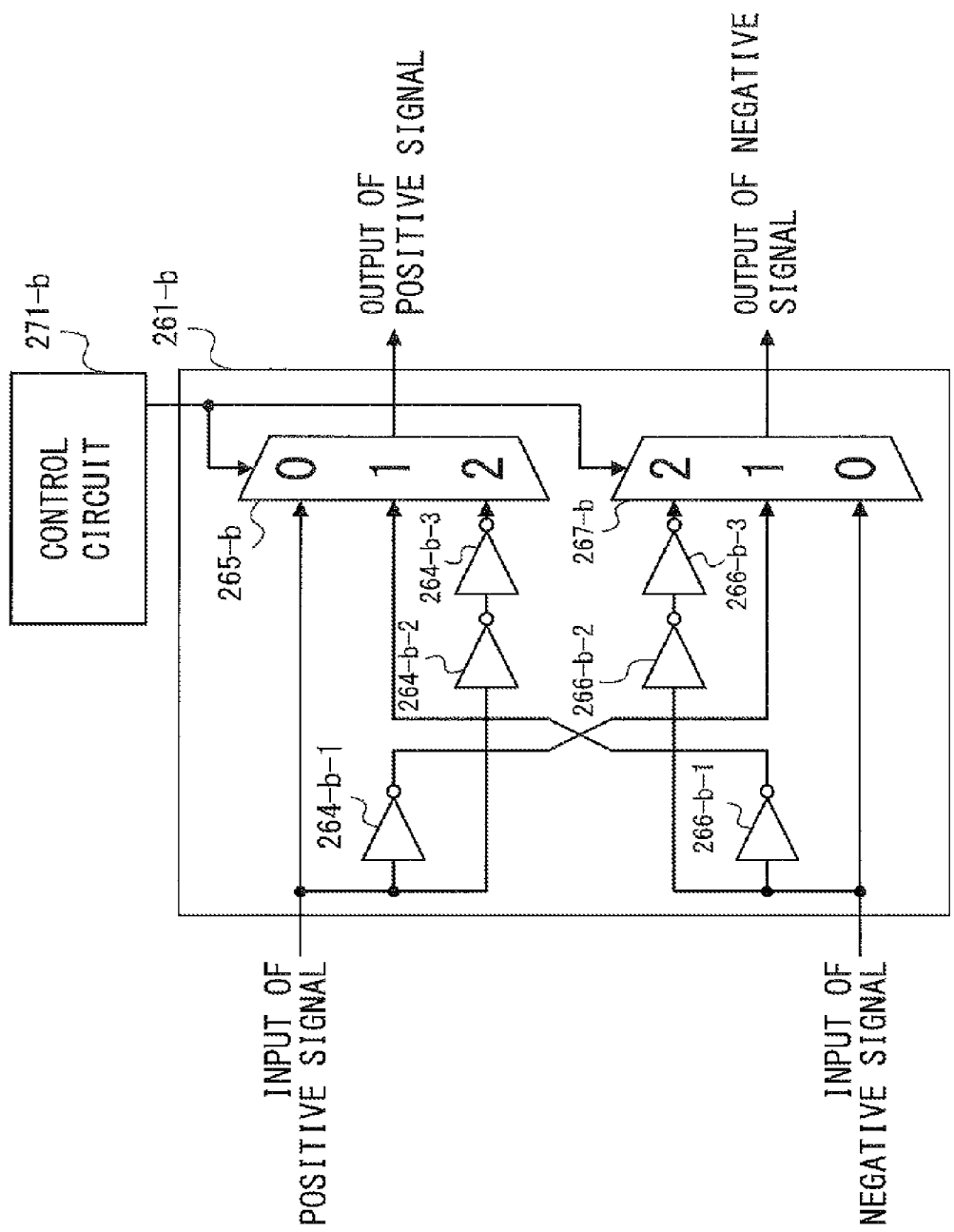
F I G. 7

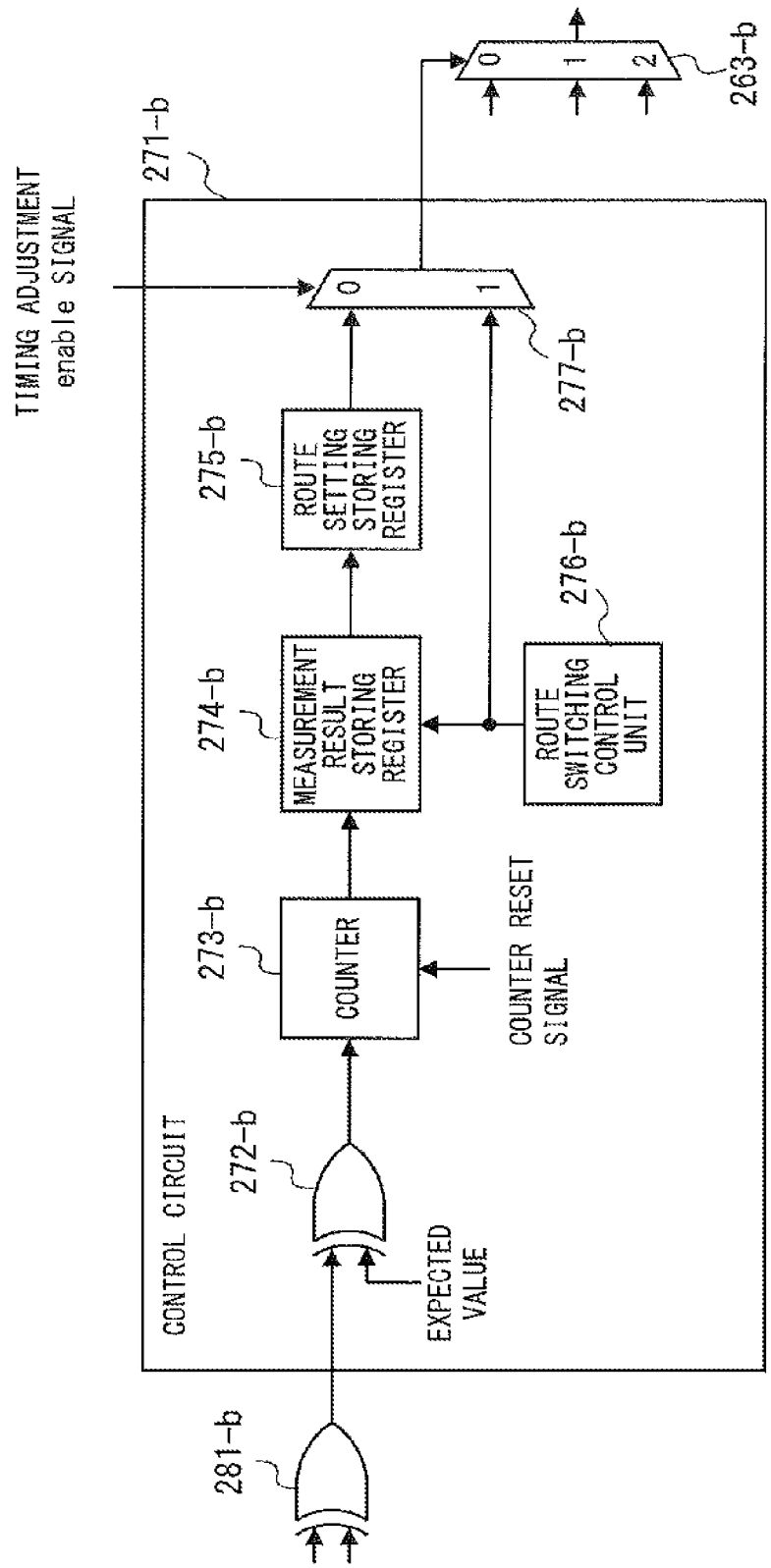
F I G. 8

PARALLEL-SERIAL CONVERSION CIRCUIT, INFORMATION PROCESSING APPARATUS AND TIMING ADJUSTMENT METHOD

CROSS-REFERENCE TO RELATED APPLICATION

This application is based upon and claims the benefit of priority of the prior Japanese Patent Application No. 2016-029831, filed on Feb. 19, 2016, the entire contents of which are incorporated herein by reference.

FIELD

The embodiments discussed herein are related to a parallel-serial conversion circuit, an information processing apparatus and a timing adjustment method.

BACKGROUND

In order to perform high-speed data communications for transceivers in a Large-Scale Integrated circuit (LSI) or between LSIs, the transmitter converts parallel data into serial data through parallel-serial conversion and the receiver performs serial-parallel conversion on the received serial data so as to generate parallel data. LSIs having a transceiver circuit are provided with a serializer, which performs serial-parallel conversion, and a deserializer, which performs parallel-serial conversion.

In parallel-serial conversion, data is transferred between a plurality of multiplexers (MUXs) in order to convert parallel data into serial data.

Higher speeds of clocks have been making it difficult to transfer data between MUXs with clock transfer. In particular, it has become difficult to properly perform data transfer to a two-input one-output MUX that uses the fastest clock in a transmission circuit.

A technique is known in which the phase of data output from the data transmission unit and the phase of the clock that defines the timing at which the data reception unit receives the data are compared so that the data transmission unit adjusts, on the basis of the comparison result, the phase of the clock that defines the timing at which the data transmission unit transmits data (see for example Patent Document 1).

Conventional timing adjustment circuits do not check whether or not the reception side is receiving data properly. This causes a problem wherein timing adjustment does not always guarantee proper data reception.

[Patent Document 1] Japanese Laid-open Patent Publication No. 2007-82147

[Patent Document 2] Japanese Laid-open Patent Publication No. 58-56553

SUMMARY

According to an aspect of the invention, a parallel-serial conversion circuit includes a data transmission unit, first and second flip flops, a selector and an adjustment unit.

The data transmission unit is configured to output first data of a prescribed pattern and second data of the prescribed pattern in accordance with a second clock obtained by dividing a first clock.

The first flip flop is configured to receive the first data so as to output the first data in accordance with the first clock.

The second flip flop is configured to receive the second data so as to output the second data in accordance with the first clock.

The selector is configured to select one of the first data output from the first flip flop and the second data output from the second flip flop so as to output the selected data in accordance with the first clock.

The adjustment unit is configured to compare the second data to be received by the second flip flop and the first data output from the first flip flop so as to adjust, on a basis of a comparison result, a timing for the first flip flop to receive the first data.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 7 is a configuration diagram of a variable delay circuit for a case when a differential signal is used;

FIG. 8 is a configuration diagram (first) of a controller circuit;

DESCRIPTION OF EMBODIMENTS

Figure 1:
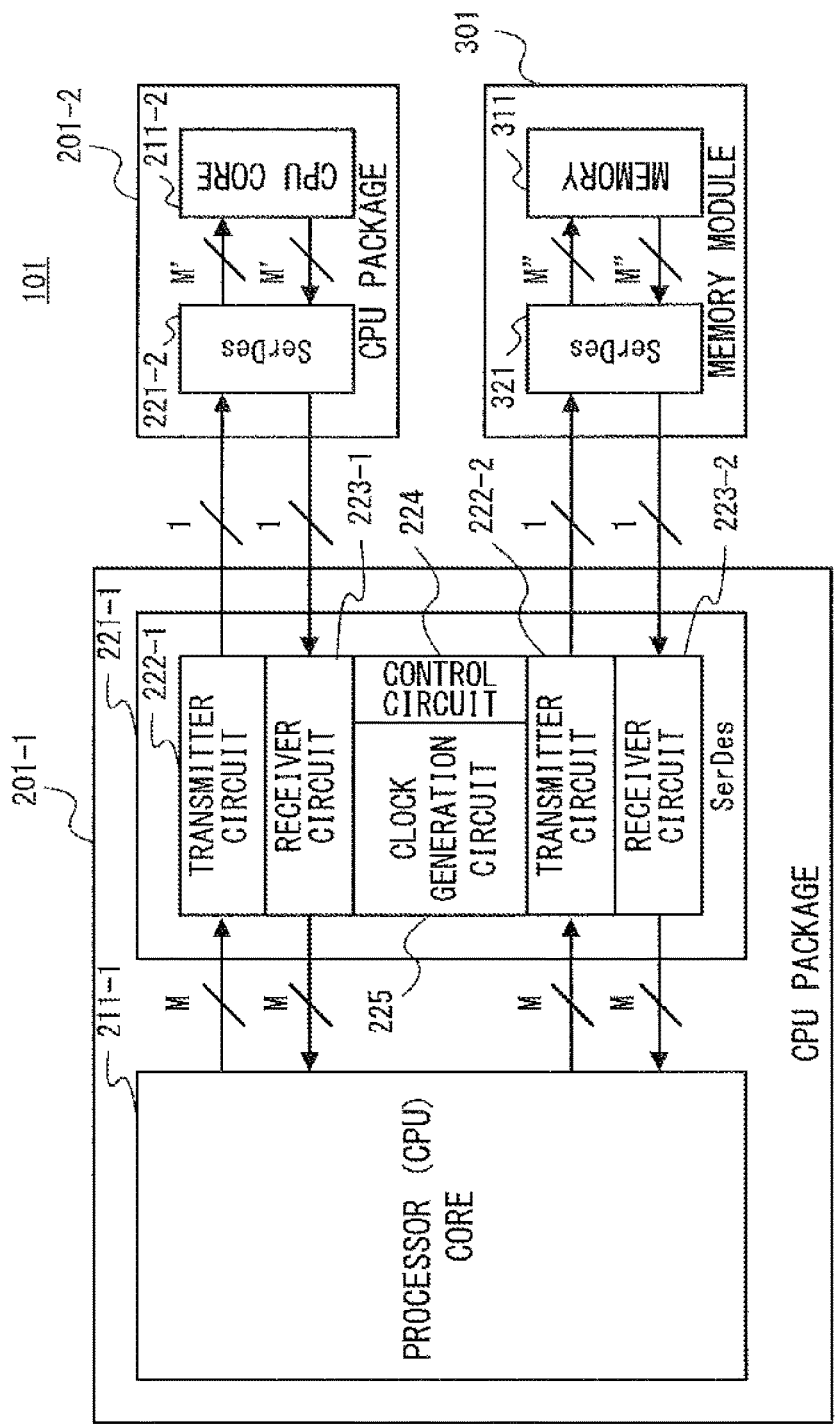
FIG. 1 is a configuration diagram of an information processing apparatus according to an embodiment.

Hereinafter, explanations will be given for the embodiments by referring to the drawings.

FIG. 1 is a configuration diagram of an information processing apparatus according to an embodiment.

An information processing apparatus 101 includes central processing unit (CPU) packages 201-$a$ ($a$=1, 2) and a memory module 301.

The CPU packages 201-1 and 201-2 are connected via a serial bus so as to perform serial communications by using serial data. The CPU package 201-1 and the memory module 301 are connected via a serial bus so as to perform serial communications by using serial data. Note that the CPU package 201-2 and the memory module 301 are connected via a serial bus so as to perform serial communications by using serial data, although this is not illustrated in FIG. 1.

The CPU package 201-a is provided with processor (CPU) cores 211-a and SERializer/DESerializers (SerDes) 221-a.

The processor cores 211-a are arithmetic devices that perform various types of processes. The processor cores 211-1 and 211-2 transmit and receive M-bit wide parallel data and M'-bit wide parallel data, respectively.

SerDes 221-1 converts the M-bit wide parallel data received from the processor core 211-1 into a 1-bit wide serial data so as to transmit it to the CPU package 201-2 or the memory module 301. Also, the SerDes 221-1 converts 1-bit wide serial data received from the CPU package 201-2 or the memory module 301 into M-bit wide parallel data so as to transmit it to the processor core 211-1.

SerDes 221-1 includes transmitter circuits 222-a, receiver circuits 223-a, a control circuit 224 and a clock generation circuit 225.

The transmitter circuit 222-1 converts M-bit wide parallel data received from the processor core 211-1 into 1-bit wide serial data so as to transmit it to the CPU package 201-2. The transmitter circuit 222-2 converts M-bit wide parallel data received from the processor core 211-1 into 1-bit wide serial data so as to transmit it to the memory module 301. The transmitter circuit 222-a is an example of a parallel-serial conversion circuit (serializer).

The receiver circuit 223-1 converts serial data received from the CPU package 201-2 so as to convert it into M-bit wide parallel data and transmit it to the processor core 211-1. The receiver circuit 223-2 converts serial data received from the memory module 301 into M-bit wide parallel data so as to transmit it to the processor core 211-1. The receiver circuit 223-a is an example of a serial-parallel conversion circuit (deserializer).

The control circuit 224 controls the transmitter circuits 222-a, the receiver circuits 223-a and the clock generation circuit 225.

The clock generation circuit 225 generates an operation clock signal (drive clock) for the transmitter circuits 222-a and the receiver circuits 223-a.

SerDes 221-2 converts M'-bit wide parallel data received from the processor core 211-2 into 1-bit wide serial data so as to transmit it to the CPU package 201-1. Also, SerDes 221-2 converts 1-bit wide serial data received from the CPU package 201-1 into M'-bit wide parallel data so as to transmit it to the processor core 211-2.

The memory module 301 is a storage device that stores data used by the processor core 211-a. The memory module 301 includes a memory chip 311 and SerDes 321.

The memory chip 311 stores data used by the processor core 211-a. The memory chip 311 transmits and receives M"-bit wide parallel data.

SerDes 321 converts M"-bit wide parallel data received from the memory chip 311 into 1-bit wide serial data so as to transmit it to the CPU package 201-a. Also, SerDes 321 converts 1-bit wide serial data received from the CPU package 201-a into M"-bit wide parallel data so as to transmit it to the memory chip 311.

Note that the configuration of the information processing apparatus 101 illustrated in FIG. 1 is an example, and the numbers of the CPU packages 201-a, the memory modules 301, the processor cores 211-a, the transceiver circuits, the receiver circuits, etc. can be changed appropriately.

Figure 2:
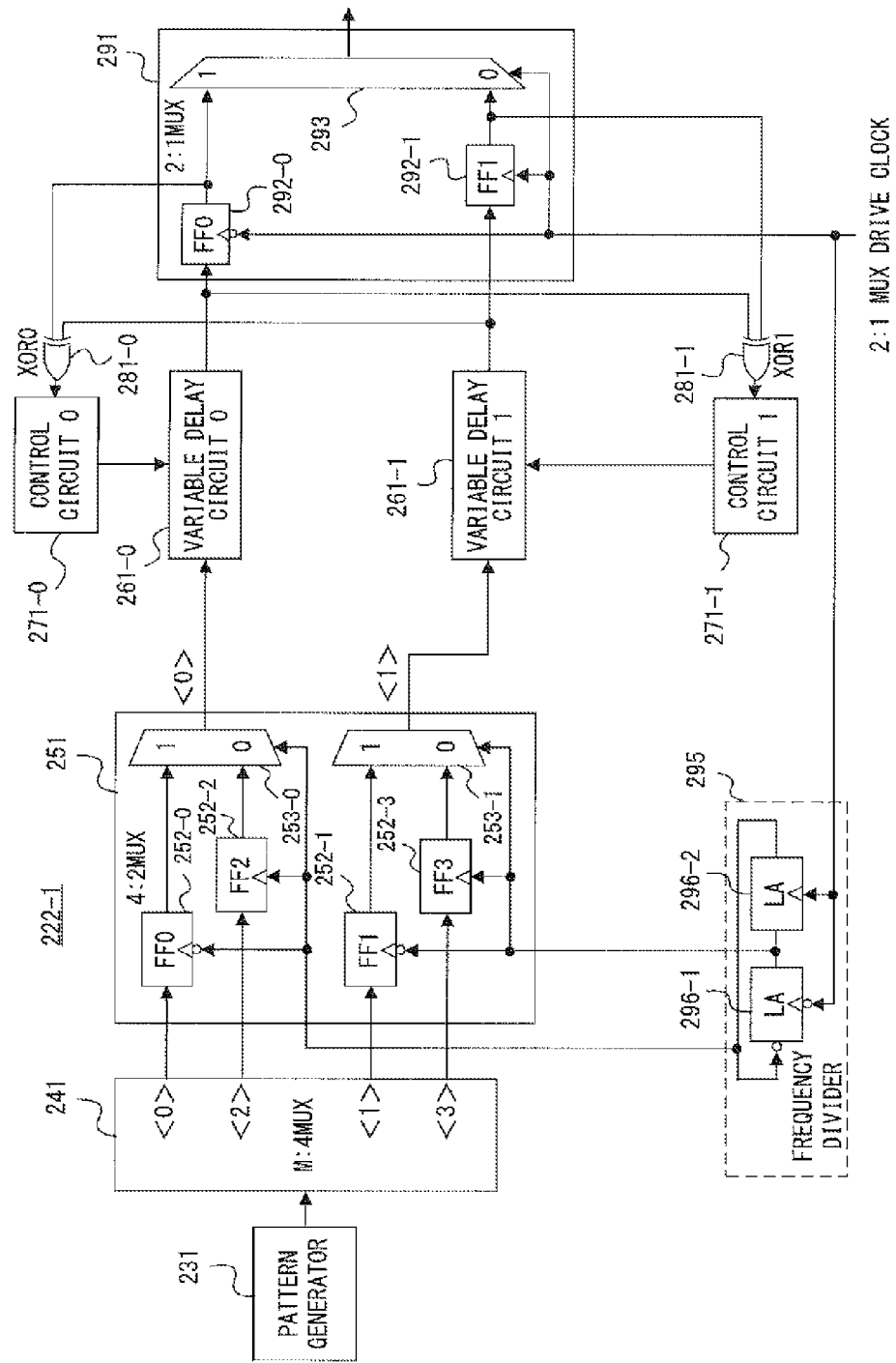
FIG. 2 is a configuration diagram (first) of a transmitter circuit according to an embodiment.

FIG. 2 is a configuration diagram (first) of a transmitter circuit according to an embodiment.

FIG. 2 explains a transmitter circuit 222-1. A transmission circuit 222-2 also has a similar configuration.

The transmission circuit 222-1 includes a pattern generator 231, an M-input 4-output multiplexer (M:4 MUX) 241, a 4-input 2-output multiplexer (4:2 MUX) 251, variable delay circuits 261-b (b=0, 1), control circuits 271-b, XOR circuits 281-b, a 2-input 1-output multiplexer (2:1 MUX) 291 and a frequency divider 295.

The pattern generator 231 generates data of a prescribed pattern so as to output it to the 4:2 MUX 251. Data of a prescribed pattern is for example data of a repeated "0011". Note that the pattern generator 231 outputs data of a prescribed pattern as M-bit wide parallel data. Note that the pattern generator 231 maybe disposed outside of the transmitter circuit 221-1 and may for example be provided to the control circuit 224. Also, the processor core 211-1 may operate as the pattern generation generator 221-1.

The M: 4 MUX 241 converts M-bit wide parallel data into 4-bit wide parallel data so as to output it to the 4:2 MUX 251. The M:4 MUX 241 outputs 4-bit wide parallel data respectively from output units 0 through 3 to flip flops (FFs) 252-0 through 252-3. The M:4 MUX 241 is connected also to a processor core 211-1 (not illustrated).

The 4:2 MUX 251 converts a 4-bit wide parallel data into a 2-bit wide parallel data so as to output it to the 2:1 MUX 291. The 4:2 MUX 251 includes flip flops (FFs) 252-c (c=0 through 3) and selectors 253-b. The 4:2 MUX 251 is an example of a data transmission unit.

To the FFs 252-c and the selectors 253-b, a clock signal (4:2 drive clock), obtained by reducing by half the frequency of a clock signal (2:1 MUX drive clock) generated by the clock generation circuit 225, is input.

The FF 252-0 is provided with an inverter in the input unit for clock signals. Thus, to the FF 252-0, a signal with an inverted 4:2 MUX drive clock is input. The FF 252-0 outputs input data in accordance with the falling edge of a 4:2 MUX drive clock. In FIG. 2, the FF 252-0 outputs data input from the output unit 0 of the M:4 MUX 241 to the selector 253-0, in accordance with the falling edge of the 4:2 MUX drive clock.

The FF 252-1 includes an inverter in the input unit for clock signals. Thus, to the FF 252-1, a signal with an inverted 4:2 MUX drive clock is input. The FF 252-1 outputs input data in accordance with the falling edge of a 4:2 MUX drive clock. In FIG. 2, the FF 252-1 outputs data input from the output unit 1 of the M:4 MUX 241 to the selector 253-1, in accordance with the falling edge of the 4:2 MUX drive clock.

The FF 252-2 has a 4:2 MUX drive clock, and outputs input data in accordance with the rising edge of the 4:2 MUX drive clock. In FIG. 2, the FF 252-2 outputs data input from the output unit 2 of the M:4 MUX 241 to the selector 253-0, in accordance with the rising edge of the 4:2 MUX drive clock.

The FF 252-3 has a 4:2 MUX drive clock input to it, and outputs input data in accordance with the rising edge of the 4:2 MUX drive clock. In FIG. 2, the FF 252-3 outputs data input from the output unit 3 of the M:4 MUX 241 to the selector 253-1, in accordance with the rising edge of the 4:2 MUX drive clock.

Note that the FFs 252-0 through 252-3 may also be referred to as FF0 through FF3, respectively.

To the selector 253-0, a 4:2 MUX drive clock and output data of the FFs 252-0 and 252-2 are input. The selector 253-0 outputs data input from the FF 252-0 when the 4:2 MUX drive clock is 1 (H), and outputs data input from the FF 252-2 when the 4:2 MUX drive clock is 0 (L). Data output from the selector 253-0 is an example of first data.

To the selector 253-1, a 4:2 MUX drive clock and output data of the FFs 252-1 and 252-3 are input. The selector 253-1 outputs data input from the FF 252-1 when the 4:2 MUX drive clock is 1 (H), and outputs data input from the FF 252-3 when the 4:2 MUX drive clock is 0 (L). Data output from the selector 253-1 is an example of second data.

Note that the selectors 253-0 and 253-1 may also be referred to as selectors 0 and 1, respectively.

The variable delay circuit 261-$b$ adjusts the phase of data output from the selector 253-$b$ in accordance with a set value. In more detail, the variable delay circuit 261-$b$ delays data output from the selector 253-$b$ in accordance with a set value so as to output it to the FF 292-$b$. Note that the variable delay circuits 261-0 and 261-1 may also be referred to as variable delay circuits 0 and 1, respectively. The variable delay circuit 261-$b$ is an example of a delay unit.

The control circuit 271-$b$ sets a set value for the variable delay circuit 261-$b$ in accordance with an output result of the XOR circuit 281-$b$. In other words, the control circuit 271-$b$ sets a delay time for the variable delay circuit 261-$b$.

The XOR circuit 281-0 outputs the exclusive OR (XOR) of the output of the FF 292-0 and the input of the FF 292-1 to the control circuit 271-0.

The XOR circuit 281-1 outputs the exclusive OR (XOR) of the output of the FF 292-1 and the input of the FF 292-0 to the control circuit 271-1.

Note that the XOR circuits 281-0 and 281-0 may also be referred to as XOR0 and XOR1, respectively. The control circuit 271-$b$ and the XOR circuit 281-$b$ are examples of the adjustment unit.

The 2:1 MUX 291 includes the FFs 292-$b$ and the selector 293.

The FF 292-0 is provided with an inverter in the input unit for clock signals. Thus, to the FF 292-0, a signal with an inverted clock (2:1 MUX drive clock) generated by the clock generation circuit 225 is input. Accordingly, the FF 292-0 outputs input data in accordance with the falling edge of the 2:1 MUX drive clock. In FIG. 2, FF 292-0 outputs data input from the variable delay circuit 261-0 to the selector 293, in accordance with the falling edge of the 2:1 MUX drive clock. Also, the FF 292-0 outputs data input from the variable delay circuit 261-0 to the XOR circuit 281-0.

The FF 292-1 has a 2:1 MUX drive clock input to it, and outputs input data in accordance with the rising edge of the 2:1 MUX drive clock. In FIG. 2, the FF 292-1 outputs data input from the variable delay circuit 261-1 to the selector 293 in accordance with the rising edge of the 2:1 MUX drive clock. Also, the FF 292-1 outputs data input from the variable delay circuit 261-1 to the XOR circuit 281-1.

To the selector 293, a 2:1 MUX drive clock and output data of the FFs 292-0 and 292-1 are input. The selector 293 outputs data input from the FF 292-0 when the 2:2 MUX drive clock is 1 (H), and outputs data input from the FF 292-1 when the 2:2 MUX drive clock is 0 (L).

Note that the FFs 292-0 and 292-1 may also be referred to as FF0 and FF1, respectively. The FFs 292-0 and 292-1 are examples of the first and second flip flops, respectively.

The frequency divider 295 includes latches 296-1 and 296-2, and outputs, to the 4:2 MUX, a clock signal (4:2 MUX drive clock) obtained by reducing by half the frequency of the input clock signal (2:1 MUX drive clock). One of the 4:2 MUX drive clocks is input to the FFs 252-0 and 252-2 and the selector 253-0. The other of the 4:2 MUX drive clocks is input to the FFs 252-1 and 252-3 and the selector 253-1. Also, one of the two 4:2 MUX drive clocks has a phase shifted by 90 degrees from the phase of the other.

Figure 3:
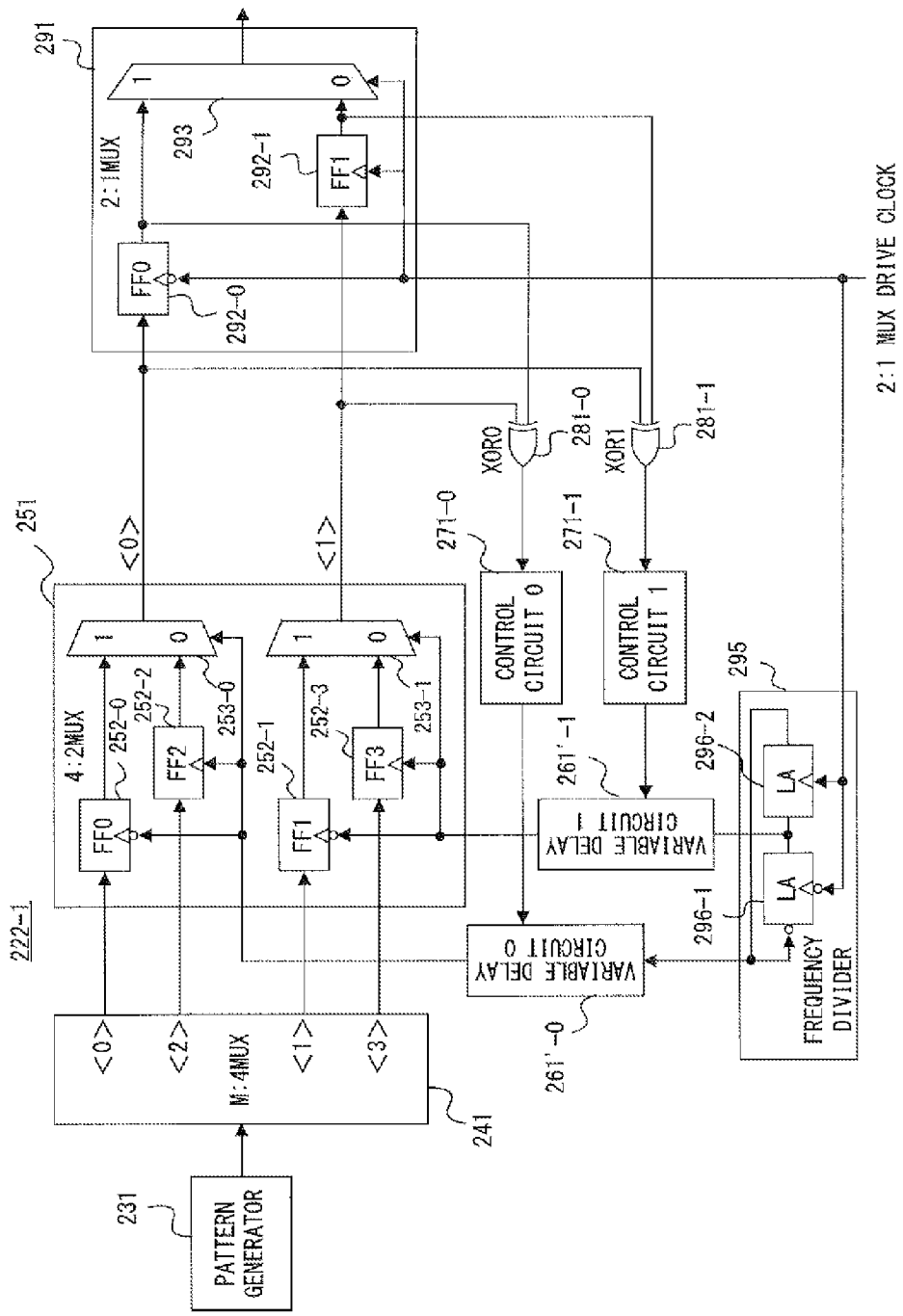
FIG. 3 is a configuration diagram (second) of a transmitter circuit according to an embodiment.

FIG. 3 is a configuration diagram (second) of a transmitter circuit according to an embodiment.

The transmitter circuit 222-1 may employ a configuration as illustrated in FIG. 3.

The transmitter circuit 222-1 includes the pattern generator 231, the M:4 MUX 241, the 4:2 MUX 251, variable delay circuits 261'-$b$ ($b$=0, 1), the control circuits 271-$b$, the XOR circuits 281-$b$, the 2:1 MUX 291 and the frequency divider 295.

The pattern generator 231, the M:4 MUX 241, the 4:2 MUX 251, the control circuits 271-$b$, the XOR circuits 281-$b$, the 2:1 MUX 291 and the frequency divider 295 have functions and configurations similar to those explained in FIG. 2, and their explanations will be omitted.

The transmitter circuit 222-1 illustrated in FIG. 3 has the variable delay circuit 261-$b$ of FIG. 2 deleted and the variable delay circuit 261'-$b$ inserted between the 4:2 MUX 251 and the frequency divider 295, which is different from the transmitter circuit 222-1 illustrated in FIG. 2.

The control circuit 271-$b$ sets a setting value for the variable delay circuit 261'-$b$ in accordance with an output result of the XOR circuit 281-$b$.

The variable delay circuit 261'-$b$ adjusts the phase of a clock signal (4:2 MUX drive clock) output from the frequency divider. In more detail, the variable delay circuit 261'-0 delays the 4:2 drive clock on the basis of the setting value so as to output it to the FFs 252-0, 252-2 and the selector 253-0. The variable delay circuit 261'-1 delays the 4:2 drive clock on the basis of the setting value so as to output it to the FFs 252-1 and 252-3 and the selector 253-1. The variable delay circuit 261'-$b$ is an example of the delay unit.

The variable delay circuit 261-$b$ illustrated in FIG. 2 delays output data of the 4:2 MUX 251 and the variable delay circuit 261'-$b$ illustrated in FIG. 3 delays a 4:2 drive clock. By delaying output data of the 4:2 MUX 251 or the 4:2 drive clock, the timing of input data for the 2:1 MUX 291 can be adjusted. This makes it possible for the 2:1 MUX 291 to receive data properly.

Figure 4:
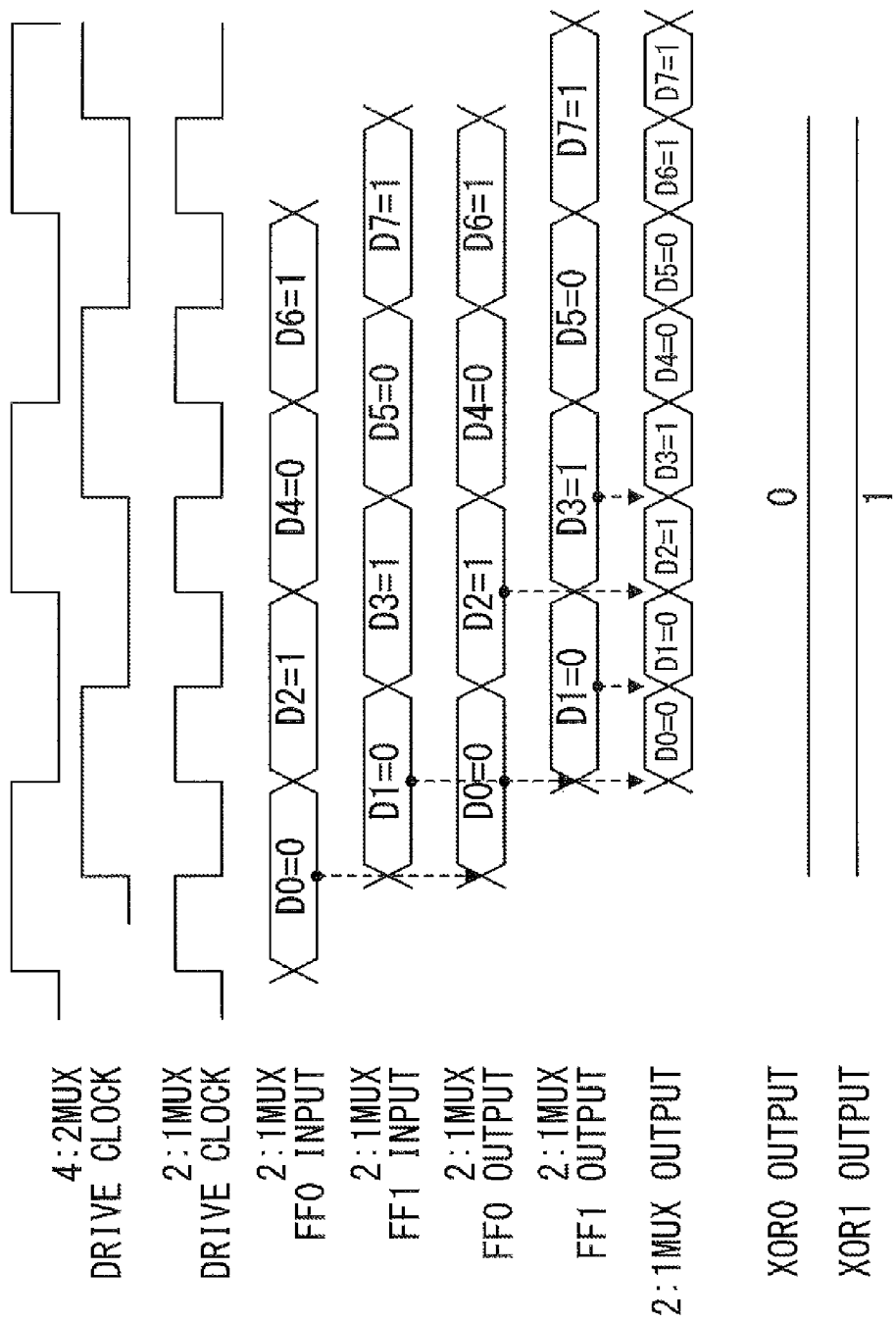
FIG. 4 is a timing chart for a case when data is transmitted and received normally.

FIG. 4 is a timing chart for a case when data is transmitted and received normally.

FIG. 4 illustrates, in order from the top, a 4:2 MUX drive clock, a 2:1 MUX drive clock, an input of FF0 of the 2:1 MUX 291, an input of FF1 of the 2:1 MUX 291, an output of FF0 of the 2:1 MUX 291, an output of FF1 of the 2:1 MUX 291, an output of the 2:1 MUX 291, an output of XOR0 and an output of XOR1. Of the two lines of the 4:2 MUX drive clock, the upper one represents the drive clock of selector 0, FF0 and FF2 of the 4:2 MUX 251, and the lower one represents the drive clock of selector 1, FF1 and FF3 of the 4:2 MUX 251.

It is assumed in FIG. 4 that pieces of data D0 through D7 with a repeated 0011 were transmitted from the pattern generator 231. Pieces of data D0 through D7 transmitted from the pattern generator 231 become 0, 0, 1, 1, 0, 0, 1 and 1 respectively.

From selector 0 of 4:2 MUX 251, pieces of data D0=0, D2=1, D4=0 and D6=1 are output sequentially in accordance with whether the 4:2 MUX drive clock (upper) is 1 (H) or 0 (L), and they become inputs of FF0 of the 2:1 MUX. The pieces of data D0=0, D2=1, D4=0 and D6=1 output from the selector 0 of the 4:2 MUX 251 are examples of first data.

From selector 1 of 4:2 MUX 251, pieces of data D1=0, D3=1, D5=0 and D7=1 are output sequentially in accordance with whether the 4:2 MUX drive clock (lower) is 1 (H) or 0 (L), and they become inputs of FF1 of the 2:1 MUX.

The pieces of data D1=0, D3=1, D5=0 and D7=1 output from the selector 1 of the 4:2 MUX 251 are examples of second data.

FF0 of the 2:1 MUX outputs input data in accordance with the falling edge of the drive clock of the 2:1 MUX. FF0 of the 2:1 MUX outputs pieces of data D0=0, D2=1, D4=0 and D6=1.

FF1 of the 2:1 MUX outputs input data in accordance with the rising edge of the drive clock of the 2:1 MUX. Ff1 of the 2:1 MUX outputs pieces of data D0=0, D3=1, D5=0 and D7=1.

The selector of the 2:1 MUX outputs an output of FF0 of the 2:1 MUX when the drive clock of the 2:1 MUX is 1 (H). The selector of the 2:1 MUX outputs an output of FF1 of the 2:1 MUX when the drive clock of the 2:1 MUX is 0 (L). As illustrated in FIG. 4, proper received data in the 2:1 MUX causes the 2:1 MUX to output pieces of data D0 through D7=00110011, which are the same as those transmitted from the pattern generator 231.

Proper received data in the 2:1 MUX as illustrated in FIG. 4 makes the input of FF1 of the 2:1 MUX and the output of FF0 of the 2:1 MUX identical. Thus, the output of XOR0 that outputs the exclusive OR of the input of FF1 of the 2:1 MUX and the output of FF0 of the 2:1 MUX is 0.

Also, proper received data in the 2:1 MUX as illustrated in FIG. 4 makes the input of FF0 of the 2:1 MUX and the output of FF1 of the 2:1 MUX different. Thus, the output of XOR1 that outputs the exclusive OR of the input of FF0 of the 2:1 MUX and the output of FF1 of the 2:1 MUX is 1.

Figure 5:
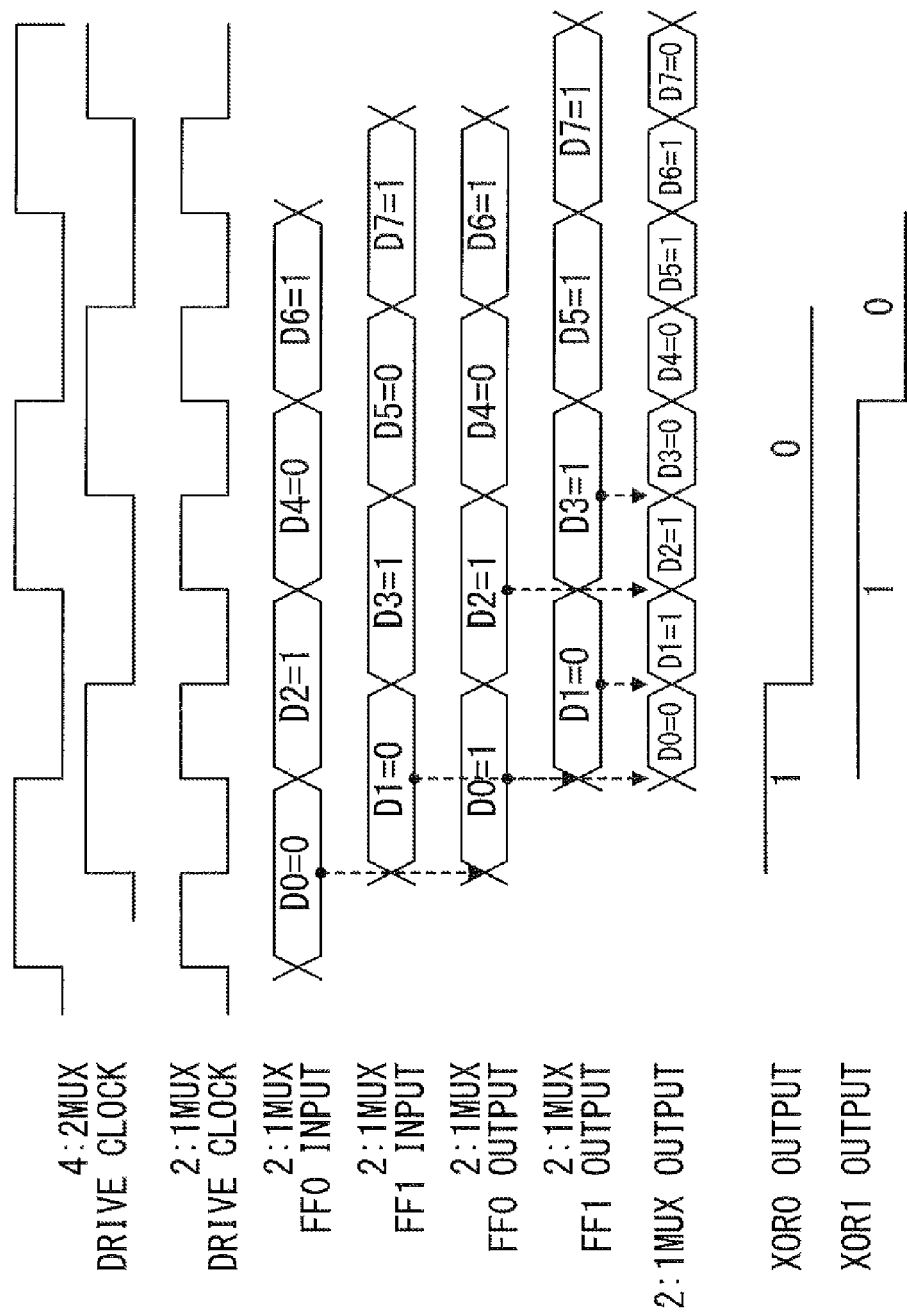
FIG. 5 is a timing chart for a case when data is not transmitted and received normally.

FIG. 5 is a timing chart for a case when data is not transmitted and received normally.

FIG. 5 illustrates, in order from the top, a 4:2 MUX drive clock, a 2:1 MUX drive clock, an input of FF0 of the 2:1 MUX 291, an input of FF1 of the 2:1 MUX 291, an output of FF0 of the 2:1 MUX 291, an output of FF1 of the 2:1 MUX 291, an output of the 2:1 MUX 291, an output of XOR0 and an output of XOR1. Of the two lines of the 4:2 MUX drive clock, the upper one represents the drive clock of selector 0, FF0 and FF2 of the 4:2 MUX 251, and the lower one represents the drive clock of selector 1, FF1 and FF3 of the 4:2 MUX 251.

It is assumed in FIG. 5 that pieces of data D0 through D7 with a repeated 0011 were transmitted from the pattern generator 231 similarly to the case of FIG. 4. Pieces of data D0 through D7 transmitted from the pattern generator 231 become 0, 0, 1, 1, 0, 0, 1 and 1 respectively.

From selector 0 of 4:2 MUX 251, pieces of data D0=0, D2=1, D4=0 and D6=1 are output sequentially in accordance with whether the 4:2 MUX drive clock (upper) is 1 (H) or 0 (L), and they become inputs of FF0 of the 2:1 MUX.

From selector 1 of 4:2 MUX 251, pieces of data D1=0, D3=1, D5=0 and D7=1 are output sequentially in accordance with whether the 4:2 MUX drive clock (lower) is 1 (H) or 0 (L), and they become inputs of FF1 of the 2:1 MUX.

FF0 of the 2:1 MUX outputs input data in accordance with the falling edge of the drive clock of the 2:1 MUX. It is assumed that FF0 of the 2:1 MUX failed to receive data D0=0 properly so that data D0=1 is treated as the output. Accordingly, FF0 of the 2:1 MUX outputs pieces of data D0=1, D2=1, D4=0 and D6=1.

Ff1 of the 2:1 MUX outputs input data in accordance with the rising edge of the drive clock of the 2:1 MUX. It is assumed that FF1 of the 2:1 MUX failed to receive data D5=0 properly so that data D5=1 is treated as the output. Accordingly, FF1 of the 2:1 MUX outputs pieces of data D1=0, D3=1, D5=1 and D7=1.

Improper received data in the 2:1 MUX as illustrated in FIG. 5 makes the input of FF1 of the 2:1 MUX and the output of FF0 of the 2:1 MUX different. Thus, the output of XOR0 that outputs the exclusive OR of the input of FF1 of the 2:1 MUX and the output of FF0 of the 2:1 MUX is 1.

Also, improper received data in the 2:1 MUX as illustrated in FIG. 5 makes the input of FF0 of the 2:1 MUX and the output of FF1 of the 2:1 MUX identical. Thus, the output of XOR1 that outputs the exclusive OR of the input of FF0 of the 2:1 MUX and the output of FF1 of the 2:1 MUX is 0.

From the above descriptions, a conclusion is drawn that proper received data in FF0 of the 2:1 MUX results in 0 for the output of XOR0 and improper received data results in 1 for the output of XOR0. Also, proper reception of data in FF1 of the 2:1 MUX results in 1 for the output of XOR1 and improper reception of the data results in 0 for the output of XOR1.

Figure 6:
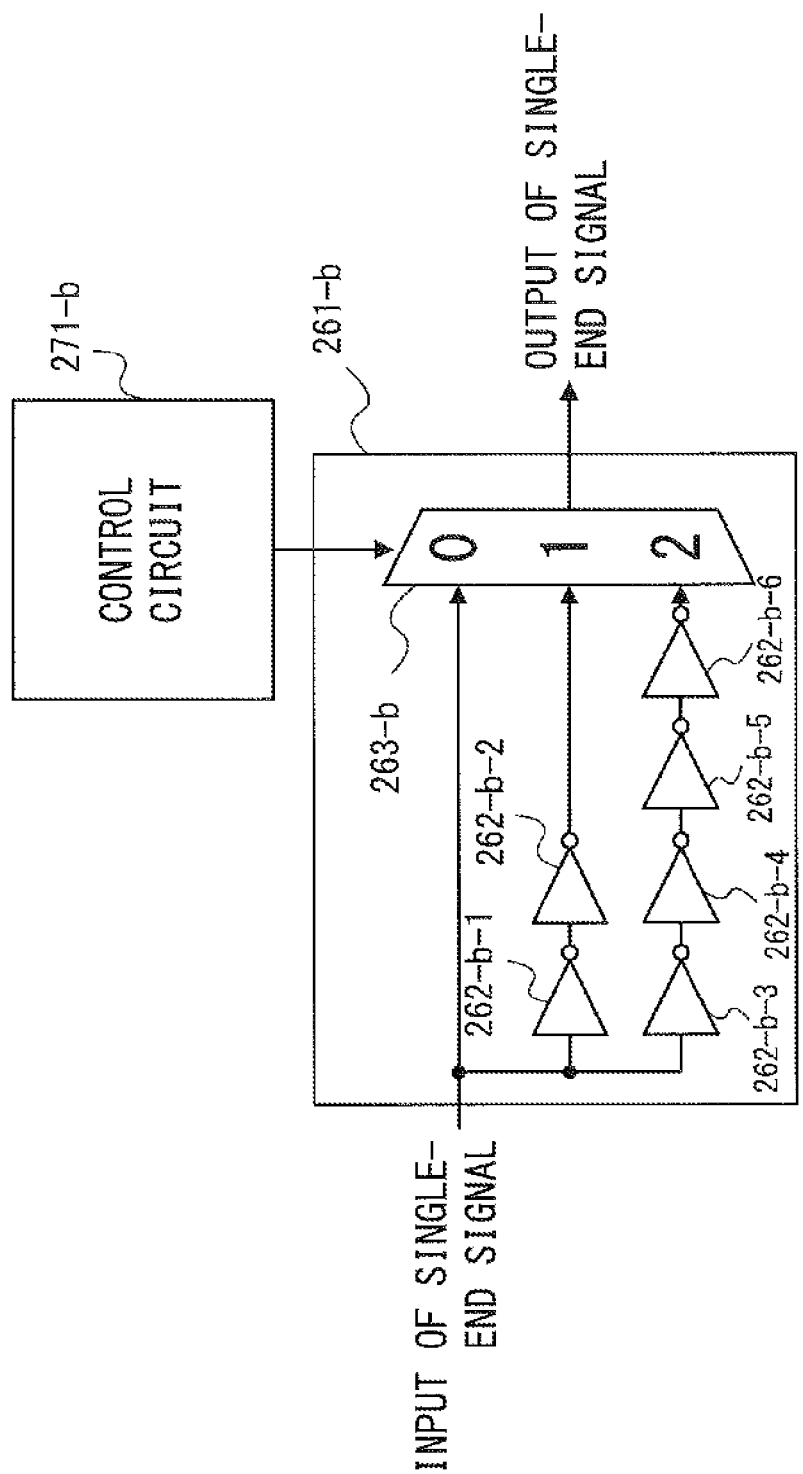
FIG. 6 is a configuration diagram of a variable delay circuit for a case when a single-end signal is used.

FIG. 6 is a configuration diagram of a variable delay circuit for a case when a single-ended signal is used.

When the transmitter circuit 222-1 operates by using a single-ended signal, e.g., when output data of the selector 253-*b* is transmitted by using a single-ended signal, the variable delay circuit 261-*b* employs a configuration as illustrated in FIG. 6.

The variable delay circuit 261-*b* includes inverters 262-*b-d* (d=1 through 6) and selectors 263-*b*.

The output of the inverter 262-*b*-1 is connected to the input of the inverter 262-*b*-2.

The output of the inverter 262-*b*-3 is connected to the input of the inverter 262-*b*-4, the output of the inverter 262-*b*-4 is connected to the input of the inverter 262-*b*-5, and the output of the inverter 262-*b*-5 is connected to the input of the inverter 262-*b*-6.

Output data input to the variable delay circuit 261-*b* from the selector 253-*b* is branched into three pieces, and the respective pieces are input to the selector 263-*b* directly, to the selector 263-*b* via the inverters 262-*b*-1 and 262-*b*-2, and to the selector 263-*b* via the inverters 262-*b*-3 through 262-*b*-6.

The data input to the selector 263-*b* is not delayed (having the phase unchanged), and data input via the inverters 262-*b*-1 and 262-*b*-2 is delayed by the two inverters 262-*b*-1 and 262-*b*-2 (having the phases changed). Also, data input via the inverters 262-*b*-3 through 262-*b*-6 is delayed, by the four inverters 262-*b*-3 through 262-*b*-6, more than data input via the inverters 262-*b*-1 and 262-*b*-2 (having the phase further changed).

On the basis of a control signal (route switching code) input from the control circuit 271-*b*, the selector 263-*b* outputs one of the pieces of input data. For example, when the route switching code=0, the selector 263-*b* outputs data input to the selector 263-*b* directly. When the route switching code=1, the selector 263-*b* outputs data that was input via the inverters 262-*b*-1 and 262-*b*-2. When the route switching code=2, the selector 263-*b* outputs data that was input via the inverters 262-*b*-3 through 262-*b*-6. On the basis of the route switching code, the selector 263-*b* outputs one of the three pieces of input data having different delay times.

Data output from the selector 263-*b* is input to the FF 292-*b*.

Note that the variable delay circuit 261'-*b* illustrated in FIG. 3 can also employ a configuration similar to that of the variable delay circuit 261-*b* illustrated in FIG. 6.

FIG. 7 is a configuration diagram of a variable delay circuit for a case when a differential signal is used.

When the transmitter circuit 222-1 operates by using a differential signal, e.g., when output data of the selector 253-$b$ is transmitted by using a differential signal, the variable delay circuit employs a configuration as illustrated in FIG. 7.

The variable delay circuit 261-$b$ includes inverters 264-$b$-3 (e=1 through 3), 266-$b$-e and selectors 265-$b$ and 267-$b$.

The input of the inverter 264-$b$-2 is connected to the input of the inverter 264-$b$-1. The output of the inverter 264-$b$-2 is connected to the input of the inverter 264-$b$-3.

The input of the inverter 266-$b$-1 is connected to the input of the inverter 266-$b$-2. The output of the inverter 266-$b$-2 is connected to the input of the inverter 266-$b$-3.

When a differential signal is used, the selector 253-$b$ outputs a positive signal similar to a single-ended signal and a negative signal obtained by inverting by the positive signal. The positive and negative signals are input to the variable delay circuit 261-$b$.

The positive signal input to the variable delay circuit 261-$b$ from the selector 253-$b$ is branched into three pieces, and the respective pieces are input to the selector 265-$b$ directly, to the selector 267-$b$ via the inverter 264-$b$-1, and to the selector 265-$b$ via the inverters 264-$b$-2 and 264-$b$-3.

The negative signal input to the variable delay circuit 261-$b$ from the selector 253-$b$ is branched into three pieces, and the respective pieces are input to the selector 267-$b$ directly, to the selector 265-$b$ via the inverter 266-$b$-1, and to the selector 267-$b$ via the inverters 266-$b$-2 and 266-$b$-3.

On the basis of a control signal (route switching code) input from the control circuit 271-$b$, the selector 265-$b$ outputs one of the pieces of input data. For example, when the route switching code=0, the selector 265-$b$ outputs the positive signal input to the selector 265-$b$ directly. When the route switching code=1, the selector 265-$b$ outputs the negative signal that was input via the inverter 266-$b$-1. When the route switching code=2, the selector 265-$b$ outputs the positive signal that was input via the inverters 264-$b$-2 and 264-$b$-3.

On the basis of the control signal (the route switching code) input from the control circuit 271-$b$, the selector 267-$b$ outputs one of the pieces of input data. For example, when the route switching code=0, the selector 267-$b$ outputs the negative signal that was input to the selector 267-$b$ directly. When the route switching code=1, the selector 267-$b$ outputs the positive signal that was input via the inverter 264-$b$-1. When the route switching code=2, the selector 265-$b$ outputs the negative signal that was input via the inverters 266-$b$-2 through 266-$b$-3.

The positive and negative signals respectively output from the selectors 265-$b$ and 267-$b$ are input to the FF 292-$b$. The FF 292-$b$ uses the difference between the positive and negative signals as input data.

FIG. 8 is a configuration diagram (first) of a controller circuit.

The control circuit 271-$b$ includes the XOR circuits 272-$b$, counters 273-$b$, measurement result storing registers 274-$b$, route setting storing registers 275-$b$, route switching control units 276-$b$ and selectors 277-$b$.

The XOR circuit 272-$b$ outputs, to the counters 273-$b$, the exclusive OR of the XOR circuit 281-$b$ and an expected value. The expected value is set by the control circuit 271-$b$, and a value output from the XOR circuit 281-$b$ when the FF 292-$b$ is receiving data properly is set. In other words, the XOR circuit 272-$b$ outputs 0 when the FF 292-$b$ is receiving data properly, and outputs 1 when the FF 292-$b$ is not receiving data properly.

The counter 273-$b$ counts the number of times that the XOR circuit 272-$b$ output 1. The counter 273-$b$ sets the count number to 0 in response to input of a counter reset signal from the route switching control units 276-$b$. The counter 273-$b$ outputs count number cnt_i and route switching code=i that corresponds to count number cnt_i to the measurement result storing register 274-$b$.

The measurement result storing register 274-$b$ stores count number cnt_i and route switching code=i input from the route switching control unit 276-$b$.

The route setting storing register 275-$b$ stores minimum count number cnt_min, which is the minimum among the count numbers that have been measured until that moment, and route switching code=i corresponding to count number cnt_min.

The route switching control unit 276-$b$ outputs route switching code=i to the measurement result storing register 274-$b$ and the selector 277-$b$.

When the timing adjustment enable signal is 0, the selector 277-$b$ outputs, to the selector 263-$b$, route switching code=i stored in the route setting storing register 275-$b$. When the timing adjustment enable signal is 1, the selector 277-$b$ outputs route switching code=i input from the route switching control unit 276-$b$.

Figure 9:
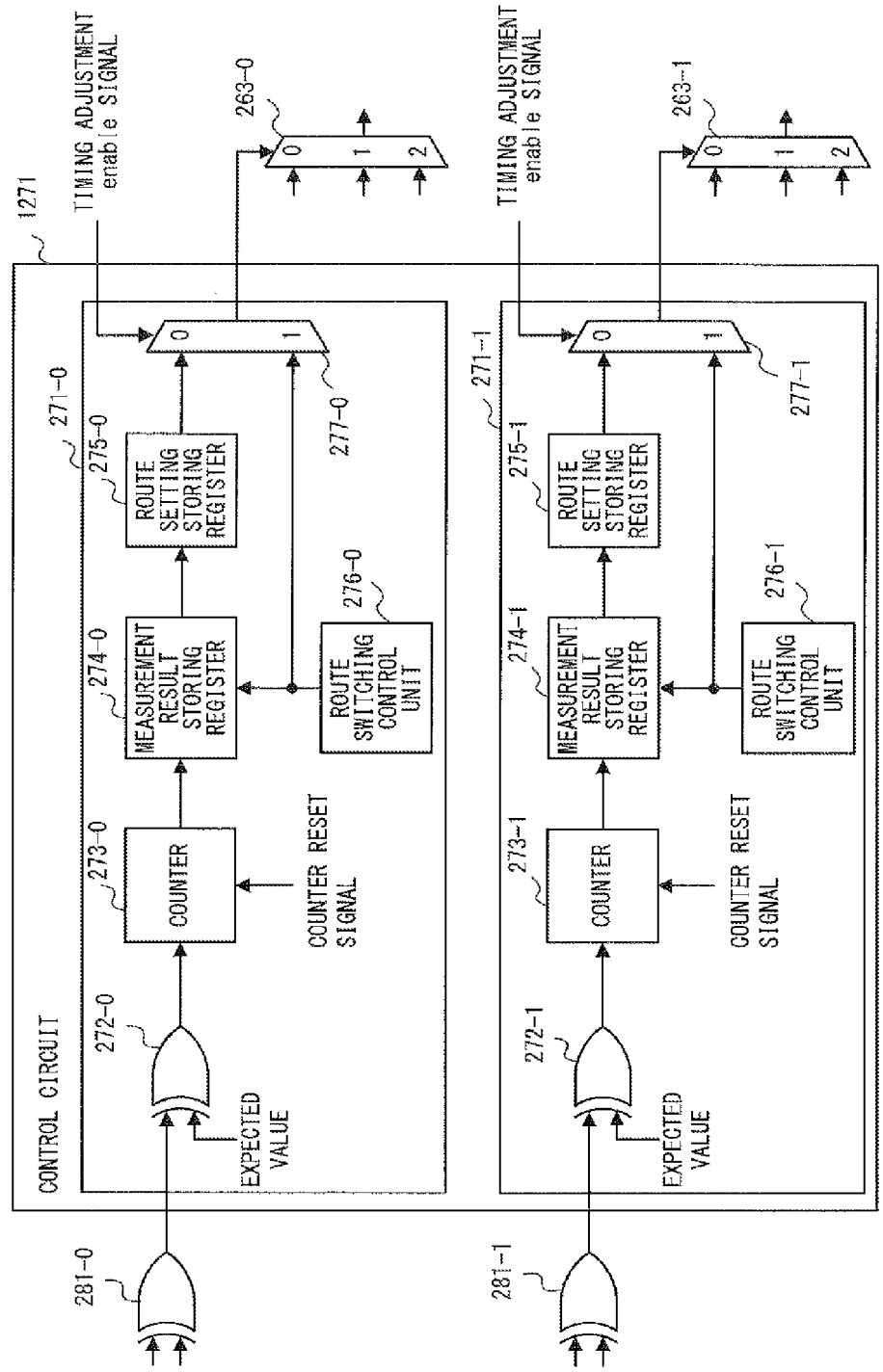
FIG. 9 is a configuration diagram (second) of the controller circuit.

FIG. 9 is a configuration diagram (second) of a control circuit.

Although the control circuits 271-0 and 271-1 are separated in the transmitter circuit 221-1 illustrated in FIG. 2, a control circuit 1271 including the control circuits 271-0 and 271-1 may be used as illustrated in FIG. 9. The control circuits 271-0 and 271-1 have configurations similar to that explained in FIG. 8, and detailed explanations thereof will be omitted.

Figure 10:
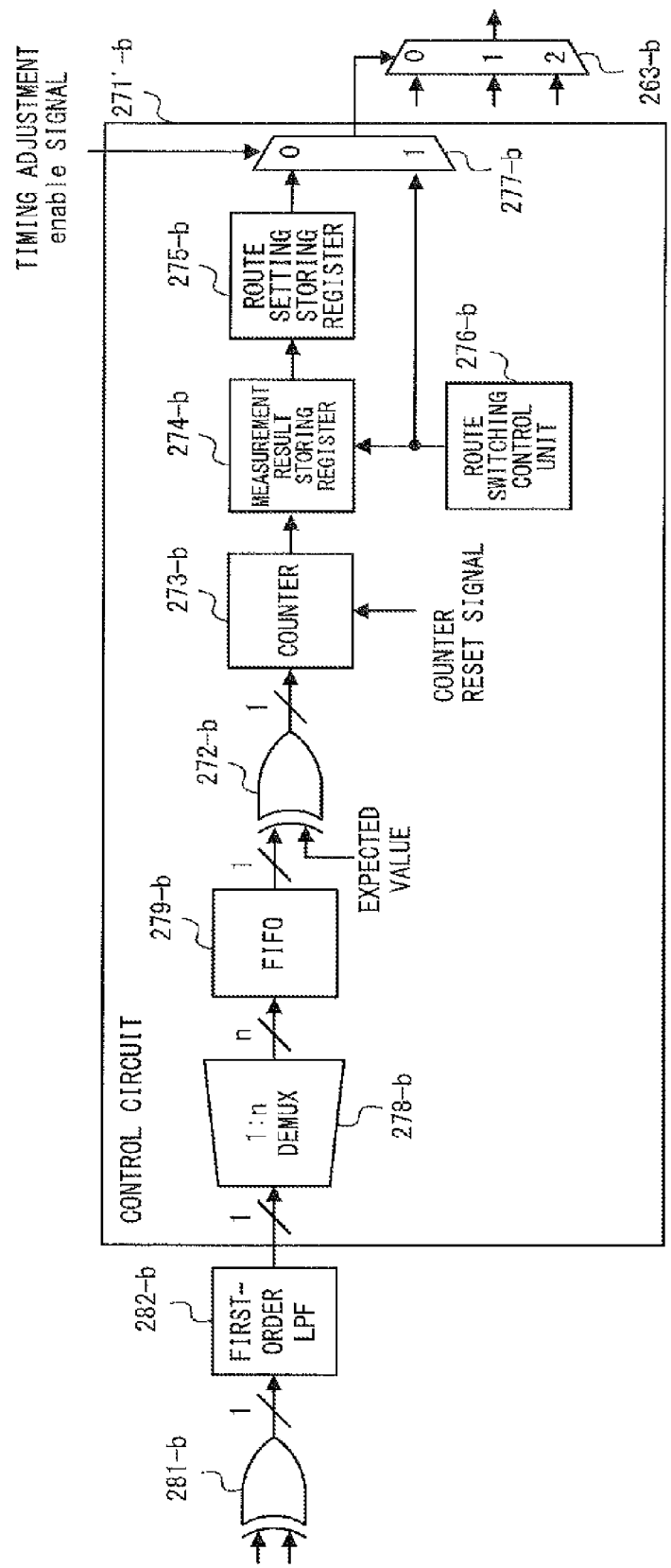
FIG. 10 is a configuration diagram (third) of the controller circuit.

FIG. 10 is a configuration diagram (third) of the control circuit.

The control circuit 271'-$b$ as illustrated in FIG. 10 may be used as the control circuit 271-$b$.

The control circuit 271'-$b$ includes the XOR circuits 272-$b$, the counters 273-$b$, the measurement result storing registers 274-$b$, the route setting storing registers 275-$b$, the route switching control units 276-$b$, and the selectors 277-$b$. The control circuit 271'-$b$ includes one-input n-output demultiplexers (1:n DMUX) 278-$b$ and FIFO 279-$b$. Also, a first-order low-pass filter (LPF) 282-$b$ is disposed between the XOR circuit 281-$b$ and 1:n DEMUX 278-$b$.

The control circuit 271'-$b$ illustrated in FIG. 10 has the 1:n DEMUX 278-$b$ and the FIFO 279-$b$ added, which is different from the control circuit 271-$b$ illustrated in FIG. 8. Also, the LPF 282-$b$ is disposed between the XOR circuit 281-$b$ and the 1:n DEMUX 278-$b$.

The LPF 282-$b$ cuts a high-frequency component output from the XOR circuit 281-$b$ so as to output it to the 1:n DEMUX 278-$b$.

The 1:n DEMUX 278-$b$ converts 1-bit wide data output from the LPF 282-$b$ into n-bit wide parallel data so as to output it to the FIFO 279-$b$.

The FIFO 279-$b$ stores data output from the 1:n DEMUX 278-$b$ so as to output 1-bit wide data thereof to the XOR circuit 272-$b$.

The XOR circuit 272-$b$ outputs, to the counter 273, the exclusive OR of the output of the FIFO 279-$b$ and an expected value. The XOR circuit 272-$b$ outputs, to the counter 273-$b$, the exclusive OR of the output of the FIFO 279-$b$ and an expected value.

The counters 273-$b$, the measurement result storing registers 274-$b$, the route setting storing registers 275-$b$, the route switching control units 276-$b$, and the selectors 277-$b$ have functions and configurations similar to those explained in FIG. 8, and explanations thereof will be omitted.

Figure 11:
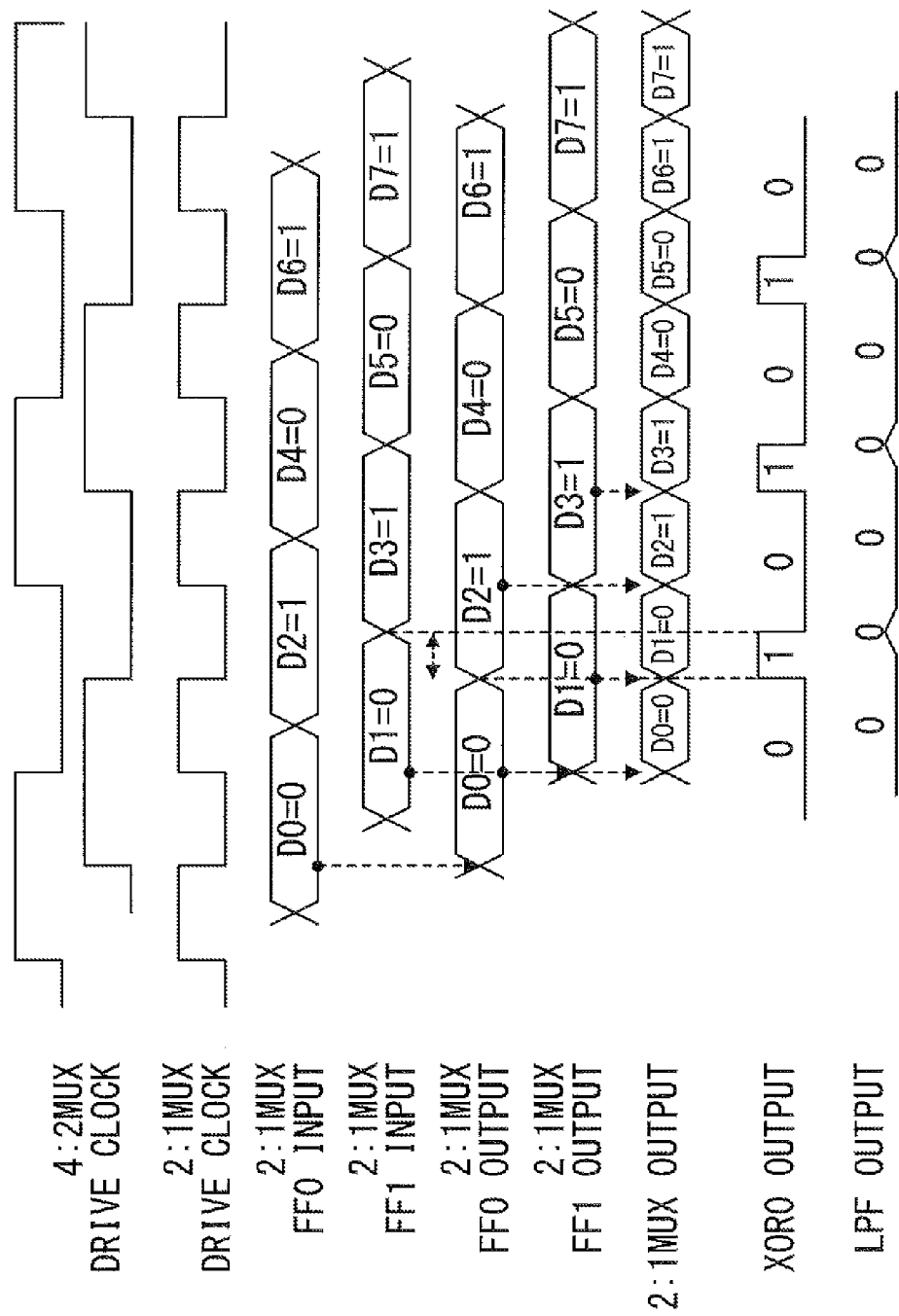
FIG. 11 is a timing chart for a case when an LPF is used.

FIG. 11 is a timing chart for a case when an LPF is used.

FIG. 11 illustrates, in order from the top, a 4:2 MUX drive clock, a 2:1 MUX drive clock, an input of FF0 of a 2:1 MUX, an input of FF1 of a 2:1 MUX, an output of FF0 of a 2:1 MUX, an output of FF1 of a 2:1 MUX, an output of a 2:1 MUX, an output of XOR0, and an output of LPF. Of the two lines of the 4:2 MUX drive clock, the upper one represents the drive clock of selector 0, FF0 and FF2 of the 4:2 MUX, and the lower one represents the drive clock of selector 1, FF1 and FF3 of the 4:2 MUX.

It is assumed in FIG. 11 that pieces of data D0 through D7 with a repeated 0011 were transmitted from the pattern generator 231 similarly to FIG. 4. Pieces of data D0 through D7 transmitted from the pattern generator 231 become 0, 0, 1, 1, 0, 0, 1 and 1 respectively.

Because the 2:1 MUX has received data properly in FIG. 11, it is desirable that the output of XOR0 be 0. However, when the phase of input/output data of the flip flop is shifted from the ideal state (FIG. 4 for example) such as in a case when the edge of the 2:1 MUX drive clock does not coincide with the center of the 2:1 MUX input data or in other cases, a glitch occurs in the outputs of XOR0 and XOR1. For example, a narrow pulse (glitch) with a value of 1 occurs in the output of XOR0.

An LPF is used for reducing such a glitch. The output of XOR0 passing through the LPF reduces a glitch as represented as the LPF output, which is at the bottom in FIG. 11, and the value is treated as 0 in the stages after the LPF.

Figure 12A:
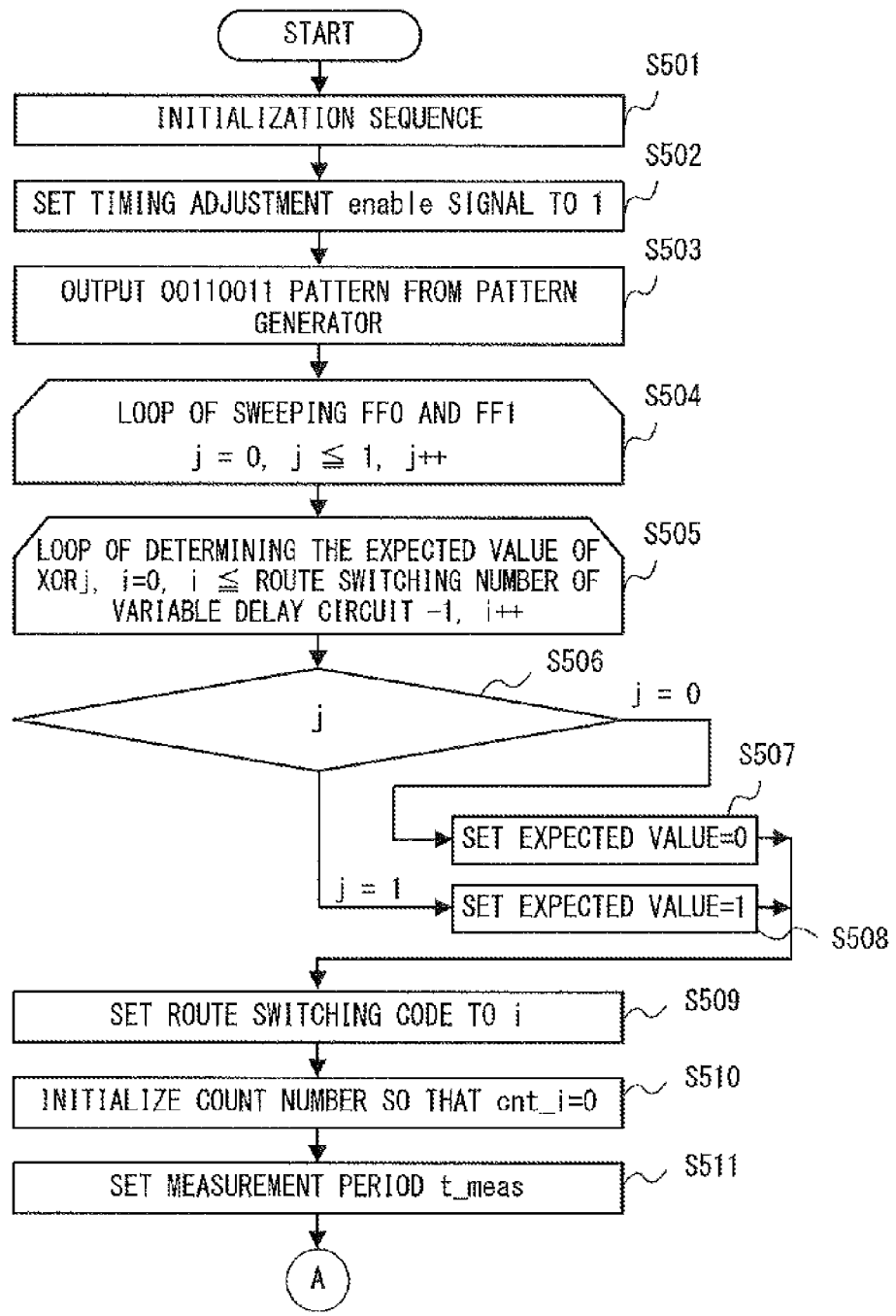
FIG. 12A is a flowchart for a timing adjustment method according to an embodiment.
Figure 12B:
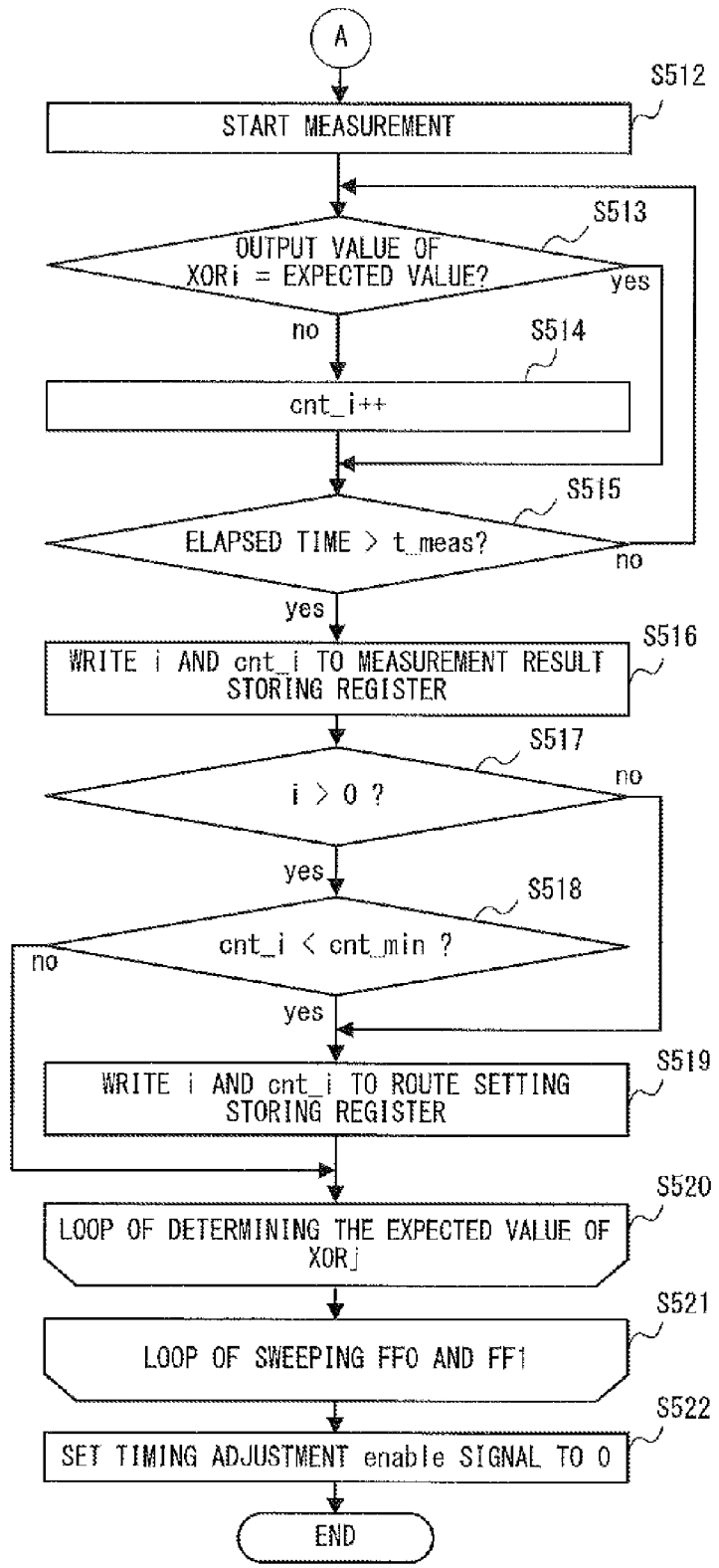
FIG. 12B is a flowchart for a timing adjustment method according to an embodiment.

FIG. 12A and FIG. 12B are flowcharts for a timing adjustment method according to an embodiment.

In step S501, the control circuit 224 performs the initialization sequence.

In step S502, the control circuit 224 sets the timing adjustment enable signal to 1.

In step S503, the pattern generator 231 outputs M-bit wide data with a repeated 0011. Data output from the pattern generator 231 is input to the M:4 MUX 241, and the M:4 MUX 241 converts the M-bit wide data into 4-bit wide data so as to output it to the 4:2 MUX 251. The 4:2 MUX 251 converts the 4-bit wide data into 2-bit wide data and outputs it. When the transmitter circuit 221-1 employs the configuration illustrated in FIG. 2, the 4:2 MUX 251 outputs the 2-bit wide data to the variable delay circuit 261-b. In more detail, the selectors 253-0 and 253-1 respectively output 1-bit wide data to the variable delay circuits 261-0 and 261-1. When the transmitter circuit 222-1 employs the configuration illustrated in FIG. 3, the 4:2 MUX 251 outputs the 2-bit wide data to the 2:1 MUX 291. In more detail, the selectors 253-0 and 253-1 respectively output 1-bit wide data to the FFs 292-0 and 292-1. Note that data output from the selectors 253-b of the 4:2 MUX 251 is data in which 0 and 1 are repeated as in 0101.

Step S504 is the starting point of a loop that sweeps FF 292-j. The initial value of variable j is 0, the condition for executing the loop is a j that is equal to or smaller than 1, and j is incremented by 1 each time the loop is terminated.

Step S505 is the starting point of a loop that determines the expected value of the XOR circuit 272-b outputs. The initial value of variable i is 0, the condition for executing the loop is an i that is equal to or smaller than a value obtained by subtracting 1 from the route switching number of the variable delay circuit 261-j, and i is incremented by 1 each time the loop is terminated. The route switching number of the variable delay circuit 261-j is the number of the types of pieces of data with different delay times that can be output from the variable delay circuit 261-j (or clock signal). In other words, it is a type of a delay time that the variable delay circuit 261-j can adjust for input data (or a clock signal). When for example the variable delay circuit 261-j employs a configuration as illustrated in FIG. 6, the selector 263-j of the variable delay circuit 261-j outputs one piece of data of pieces of data with different delay times of three types, and thus the route switching number is 3. Accordingly, the condition for executing the loop is an i that is equal to or smaller than 2.

In step S506, the control circuit 271-j determines the value of j. When j=0, the control proceeds to step S507, and when j=1, the control proceeds to step S508.

In step S507, the control circuit 271-j sets the expected value to 0.

In step S508, the control circuit 271-j sets the expected value to 1.

In step S509, the route switching control unit 276-j outputs route switching code=i to the selector 277-j. The selector 277-j outputs route switching code=i to the selector 263-j of the variable delay circuit 261-j. On the basis of input route switching code=i, the selector 263-j outputs one of the pieces of input data.

In step S510, the route switching control unit 276-j outputs a counter reset signal to the counter. The counter 273-j initializes counter number cnt_i to 0.

In step S511, the control circuit 271-j sets measurement period t_meas.

In step S512, the control circuit 271-j starts measurement.

In step S513, the XOR circuit 272-j compares the output of the XOR circuit 281-j and the expected value. When the output of the XOR circuit 281-j and the expected value are identical, the control proceeds to step S515, and when they are not, the control proceeds to step S514. In more detail, the XOR circuit 272-j outputs the XOR of the output of the XOR circuit 281-j and the expected value. In other words, when the output of the XOR circuit 281-j and the expected value are identical, 0 is output, and when they are not, 1 is output.

In step S514, the counter 273-j increments count number cnt_i by 1. In other words, the counter 273-j increments count number cnt_i by 1 when 1 is output from the XOR circuit 272-j.

In step S515, the control circuit 271-j determines whether or not the elapsed time since the start of the measurement in step S512 has exceeded measurement period t_meas. When the elapsed time has exceeded measurement period t_meas, the controller proceeds to step S516, and when it does not, the control proceeds to step S513.

In step S516, the measurement result storing register 274-j stores route switching code=i and count number cnt_i.

In step S517, the control circuit 271-j determines the value of i. When i is greater than 0, the control proceeds to step S518, and when i is 0, the control proceeds to step S519.

In step S518, the control circuit 271-j compares count number cnt_i and count number cnt_min stored in the route setting storing register 275-j. When count number cnt_i is smaller than count number cnt_min, the control proceeds to step S 519, and when count number cnt_min is equal to or greater than count number cnt_min, the control proceeds to step S 520.

In step S519, the route setting storing register 275-j stores route switching code=i and count number cnt_i. It is assumed in this example that count number cnt_i stored in the route setting storing register 275-j is count number cnt_min.

Step S520 is the termination point of the loop that determines the expected value of the XORj. The control circuit 271-j increments i by 1. When i is equal to or smaller than a value obtained by subtracting 1 from the route switching number of the variable delay circuit 261-j, the control returns to step S505, which is the starting point of the loop, and when i is greater than a value obtained by subtracting 1 from the route switching number of the variable delay circuit 261-j, the control proceeds to step S521.

Step S521 is the termination point of the loop that sweeps the FF 292-j. The control circuit 271-j increments j by 1. When j is equal to or smaller than 1, the control returns to step S504, which is the starting point of the loop, and when j is greater than 1, the control proceeds to step S522.

In step S522, the control circuit 224 sets the timing adjustment enable signal to 0.

In this example, explanations will be given for a response to be made in a case when input data of the 2:1 MUX 291 involves a delay of 1 UI (Unit Interval) or longer.

For example, the FF 292-0 illustrated in FIG. 2 takes in input data at the falling edge of the 2:1 MUX drive clock after data is output from the 4:2 MUX 251.

The transmitter circuit 222-1 has not determined whether the phase of data output from the 4:2 MUX 251 is ahead or behind, and the variable delay circuit 261-b can only perform a control of delaying data. This may lead, depending upon a delay process performed by the variable delay circuit 261-1, to a possibility that the FF 292-0 will take in input data at the falling edge of a clock that is one cycle subsequent to the falling edge of the clock at which the input data is originally to be taken in. When input data of the 2:1 MUX 291 is delayed by 1 UI or longer, there is a possibility that the FF 292-0 will take in input data at the falling edge of a clock that is one cycle subsequent to the falling edge of the clock at which the input data is originally to be taken in. This is a prohibited behavior, which works against the design concept of synchronous circuits.

In such a case, the transmission circuit 222-1 illustrated in FIG. 2 is changed as below.

The inverter in the input unit for a clock signal of the FF 292-0 is removed. Thereby, the FF 292-0 takes in input data so as to output it, in accordance with the rising edge of the 2:1 MUX drive clock.

The FF 292-1 is provided with an inverter in the input unit for clock signals. Thereby, the FF 292-1 takes in input data so as to output it, in accordance with the falling edge of the 2:1 MUX drive clock.

The control logic of data output of the selector 293 is inverted. In other words, the selector 291 outputs input data from the FF 292-0 when the 2:1 MUX drive clock is 0 (L), and outputs input data from the FF 292-1 when the 2:1 MUX drive clock is 1 (H).

The above configuration makes it possible for the transmission circuit 222-1 to behave properly even when input data of the 2:1 MUX 291 involves a delay of 1 UI or longer.

The parallel-serial conversion of the embodiment makes it possible to adjust reception timing so that the multiplexer can receive data properly, while determining whether or not the multiplexer received data properly.

While the embodiment has been described above, all examples and conditional language provided herein are intended for pedagogical purposes to aiding the reader in understanding the invention and the concepts contributed by the inventor to further the art. In particular, the provided examples and conditions are not to be construed as being limitations to the scope of the invention, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

All examples and conditional language provided herein are intended for pedagogical purposes to aiding the reader in understanding the invention and the concepts contributed by the inventor to further the art, and are not to be construed as being limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A parallel-serial conversion circuit comprising:
   a data transmission unit configured to output first data of a prescribed pattern and second data of the prescribed pattern in accordance with a second clock obtained by dividing a first clock;
   a first flip flop configured to receive the first data so as to output the first data in accordance with the first clock;
   a second flip flop configured to receive the second data so as to output the second data in accordance with the first clock;
   a selector configured to select one of the first data output from the first flip flop and the second data output from the second flip flop so as to output the selected data in accordance with the first clock;
   an XOR circuit configured to output an exclusive OR of the second data to be received by the second flip flop and the first data output from the first flip flop; and
   a control circuit configured to adjust, based on the exclusive OR, a timing for the first flip flop to receive the first data.

2. The parallel-serial conversion circuit according to claim 1, further comprising
   a delay unit configured to delay, by a set time, the first data output from the data transmission unit, wherein
   the control circuit sets the set time to one of a plurality of delay times, the XOR circuit repeats a process of outputting the exclusive OR of the second data to be received by the second flip flop and the first data output from the first flip flop, and the control circuit sets, as the set time, a delay time that corresponds to a comparison result indicating that a greatest number of the first flip flops received the first data properly from among a plurality of comparison results based on the exclusive OR.

3. The parallel-serial conversion circuit according to claim 1, further comprising
   a delay unit configured to delay the second clock by a set time, wherein
   the control circuit sets the set time to one of a plurality of delay times, the XOR circuit repeats a process of outputting the exclusive OR of the second data to be received by the second flip flop and the first data output from the first flip flop, and the control circuit sets, as the set time, a delay time that corresponds to a comparison result indicating that a greatest number of the first flip flops received the first data properly from among a plurality of comparison results based on the exclusive OR.

4. The parallel-serial conversion circuit according to claim 1, wherein the prescribed pattern is a repeated 0 and 1.

5. The parallel-serial conversion circuit according to claim 4, further comprising
a pattern generation unit configured to generate third data of another pattern that is a repeated 0011, wherein
the data transmission unit transmits the prescribed pattern on a basis of the third data.

6. An information processing apparatus including a parallel-serial conversion circuit, wherein
the parallel-serial conversion circuit comprises:
a data transmission unit configured to output first data of a prescribed pattern and second data of the prescribed pattern in accordance with a second clock obtained by dividing a first clock;
a first flip flop configured to receive the first data so as to output the first data in accordance with the first clock;
a second flip flop configured to receive the second data so as to output the second data in accordance with the first clock;
a selector configured to select one of the first data output from the first flip flop and the second data output from the second flip flop so as to output the selected data in accordance with the first clock;
an XOR circuit configured to output an exclusive OR of the second data to be received by the second flip flop and the first data output from the first flip flop; and
a control circuit configured to adjust, based on the exclusive OR, a timing for the first flip flop to receive the first data.

7. The information processing apparatus according to claim 6, further comprising
a delay unit configured to delay, by a set time, the first data output from the data transmission unit, wherein
the control circuit sets the set time to one of a plurality of delay times, the XOR circuit repeats a process of outputting the exclusive OR of the second data to be received by the second flip flop and the first data output from the first flip flop, and the control circuit sets, as the set time, a delay time that corresponds to a comparison result indicating that a greatest number of the first flip flops received the first data properly from among a plurality of comparison results based on the exclusive OR.

8. The information processing apparatus according to claim 6, further comprising
a delay unit configured to delay the second clock by a set time, wherein
the control circuit sets the set time to one of a plurality of delay times, the XOR circuit repeats a process of outputting the exclusive OR of the second data to be received by the second flip flop and the first data output from the first flip flop, and the control circuit sets, as the set time, a delay time that corresponds to a comparison result indicating that a greatest number of the first flip flops received the first data properly from among a plurality of comparison results based on the exclusive OR.

9. The information processing apparatus according to claim 6, wherein the prescribed pattern is a repeated 0 and 1.

10. The information processing apparatus according to claim 9, further comprising
a pattern generation unit configured to generate third data of another pattern that is a repeated 0011, wherein
the data transmission unit transmits the prescribed pattern on a basis of the third data.

11. A timing adjustment method of a parallel-serial conversion circuit, the timing adjustment method comprising:
outputting, by a data transmission unit, first data of a prescribed pattern and second data of the prescribed pattern in accordance with a second clock obtained by dividing a first clock;
receiving, by a first flip flop, the first data so as to output the first data in accordance with the first clock,
receiving, by a second flip flop, the second data so as to output the second data in accordance with the first clock;
selecting, by a selector, one of the first data output from the first flip flop and the second data output from the second flip flop so as to output the selected data in accordance with the first clock;
outputting, by an XOR circuit, an exclusive OR of the second data to be received by the second flip flop and the first data output from the first flip flop; and
adjusting, by a control circuit, based on the exclusive OR, a timing for the first flip flop to receive the first data.

12. The timing adjustment method according to claim 11, wherein
a delay unit delays, by a set time, the first data output from the data transmission unit, and
the control circuit sets the set time to one of a plurality of delay times, the XOR circuit repeats a process of outputting the exclusive OR of the second data to be received by the second flip flop and the first data output from the first flip flop, and the control circuit sets, as the set time, a delay time that corresponds to a comparison result indicating that a greatest number of the first flip flops received the first data properly from among a plurality of comparison results based on the exclusive OR.

13. The timing adjustment method according to claim 11, wherein
the parallel-serial conversion circuit further comprises a delay unit configured to delay the second clock by a set time, and
the control circuit sets the set time to one of a plurality of delay times, the XOR circuit repeats a process of outputting the exclusive OR of the second data to be received by the second flip flop and the first data output from the first flip flop, and the control circuit sets, as the set time, a delay time that corresponds to a comparison result indicating that a greatest number of the first flip flops received the first data properly from among a plurality of comparison results based on the exclusive OR.

14. The timing adjustment method according to claim 11, wherein the prescribed pattern is a repeated 0 and 1.

15. The timing adjustment method according to claim 14, wherein
a pattern generation unit generates third data of another pattern that is a repeated 0011, and
the data transmission unit transmits the prescribed pattern on a basis of the third data.

* * * * *